(12) United States Patent
Xu et al.

(10) Patent No.: US 10,535,754 B2
(45) Date of Patent: Jan. 14, 2020

(54) METHOD AND STRUCTURE FOR FORMING A VERTICAL FIELD-EFFECT TRANSISTOR

(71) Applicant: International Business Machines Corporation, Armonk, NY (US)

(72) Inventors: Peng Xu, Santa Clara, CA (US); ChoongHyun Lee, Rensselaer, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/000,563

(22) Filed: Jun. 5, 2018

(65) Prior Publication Data

US 2019/0371920 A1 Dec. 5, 2019

(51) Int. Cl.
| | |
|---|---|
| *H01L 29/66* | (2006.01) |
| *H01L 29/423* | (2006.01) |
| *H01L 29/08* | (2006.01) |
| *H01L 21/8238* | (2006.01) |
| *H01L 29/78* | (2006.01) |
| *H01L 21/8234* | (2006.01) |

(52) U.S. Cl.
CPC ......... *H01L 29/66666* (2013.01); *H01L 21/823418* (2013.01); *H01L 21/823487* (2013.01); *H01L 21/823814* (2013.01); *H01L 29/0843* (2013.01); *H01L 29/42356* (2013.01); *H01L 29/66787* (2013.01); *H01L 29/7827* (2013.01)

(58) Field of Classification Search
CPC .......... H01L 29/66666; H01L 29/0843; H01L 29/42356; H01L 29/66787; H01L 29/7827; H01L 29/823418; H01L 29/823487; H01L 29/823814
See application file for complete search history.

(56) References Cited

U.S. PATENT DOCUMENTS

| | | | |
|---|---|---|---|
| 8,536,029 B1 * | 9/2013 | Chang | H01L 21/845 257/29 |
| 9,257,553 B2 | 2/2016 | Lee | |
| 9,443,963 B2 | 9/2016 | Kerber et al. | |
| 9,640,636 B1 | 5/2017 | Bentley et al. | |
| 9,741,626 B1 | 8/2017 | Cheng et al. | |

(Continued)

*Primary Examiner* — Yosef Gebreyesus
(74) *Attorney, Agent, or Firm* — Vazken Alexanian; Ryan, Mason & Lewis, LLP

(57) ABSTRACT

A method for manufacturing a semiconductor device includes forming a first semiconductor layer on a semiconductor substrate, forming a second semiconductor layer including a first concentration of germanium on the first semiconductor layer, and forming a third semiconductor layer on the second semiconductor layer. The first and third semiconductor layers each have a concentration of germanium, which is greater than the first concentration of germanium. The first, second and third semiconductor layers are patterned into at least one fin. The method further includes covering the second semiconductor layer with a mask layer. In the method, a bottom source/drain region and a top source/drain region are simultaneously grown from the first semiconductor layer and the third semiconductor layer, respectively. The mask layer is removed from the second semiconductor layer, and a gate structure is formed on and around the second semiconductor layer.

14 Claims, 11 Drawing Sheets

(56) References Cited

U.S. PATENT DOCUMENTS

| | | |
|---|---|---|
| 9,761,728 B1 | 9/2017 | Cheng et al. |
| 9,837,410 B1 | 12/2017 | Cheng |
| 2011/0012085 A1* | 1/2011 | Deligianni ............. B82Y 10/00 |
| | | 257/9 |
| 2017/0358497 A1 | 12/2017 | Cheng et al. |
| 2018/0019337 A1 | 1/2018 | Xie et al. |
| 2018/0097106 A1* | 4/2018 | Zhu ................... H01L 21/02532 |
| 2018/0175200 A1* | 6/2018 | Lee ..................... H01L 29/7851 |

* cited by examiner

METHOD AND STRUCTURE FOR FORMING A VERTICAL FIELD-EFFECT TRANSISTOR

TECHNICAL FIELD

The field generally relates to semiconductor devices and methods of manufacturing same and, in particular, to forming a vertical field effect transistor (VFET) using processes that rely on a relationship between critical temperature for oxide conversion and germanium concentration in a semiconductor layer.

BACKGROUND

Fin field-effect transistor (FinFET) devices include a transistor architecture that uses raised source-to-drain channel regions, referred to as fins. A FinFET device can be built on a semiconductor substrate, where a semiconductor material, such as silicon, is patterned into fin-like shapes and functions as the channels of the transistors. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field effect transistors (VFETs) are becoming viable device options for semiconductor devices, for example, complementary metal oxide semiconductor (CMOS) devices, beyond 7 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to extend the product value proposition beyond conventional plateaus and address the limitations of horizontal device architectures by, for example, decoupling of gate length from the contact gate pitch, providing a FinFET-equivalent density at a larger contacted poly pitch (CPP), and providing lower MOL resistance.

Conventional VFET integration processes are complicated, including multiple steps for bottom and top source/drain region, bottom and top spacer, high-k dielectric and metal gate formation. Accordingly, there is a need for a VFET structure and method of forming same that can utilize simplified integration processes.

SUMMARY

According to an exemplary embodiment of the present invention, a method for manufacturing a semiconductor device includes forming a first semiconductor layer on a semiconductor substrate, forming a second semiconductor layer including a first concentration of germanium on the first semiconductor layer, and forming a third semiconductor layer on the second semiconductor layer. The first and third semiconductor layers each have a concentration of germanium, which is greater than the first concentration of germanium. The first, second and third semiconductor layers are patterned into at least one fin. The method further includes covering the second semiconductor layer with a mask layer. In the method, a bottom source/drain region and a top source/drain region are simultaneously grown from the first semiconductor layer and the third semiconductor layer, respectively. The mask layer is removed from the second semiconductor layer, and a gate structure is formed on and around the second semiconductor layer.

According to an exemplary embodiment of the present invention, a vertical field-effect transistor device includes at least one fin disposed on a semiconductor substrate. The at least one fin includes a semiconductor channel layer comprising a first concentration of germanium. A bottom source/drain region is adjacent a lower portion of the at least one fin, and a top source/drain region is above the semiconductor channel layer. The vertical field-effect transistor device further includes a gate structure between the top and bottom source/drain regions. The top and bottom source/drain regions each have a concentration of germanium, which is greater than the first concentration of germanium, and the gate structure is aligned with the top source/drain region.

According to an exemplary embodiment of the present invention, a method for manufacturing a vertical field-effect transistor includes forming a first semiconductor layer on a semiconductor substrate, forming a second semiconductor layer having a first concentration of germanium on the first semiconductor layer, and forming a third semiconductor layer on the second semiconductor layer. The first and third semiconductor layers each have a concentration of germanium, which is greater than the first concentration of germanium. The first, second and third semiconductor layers are patterned into at least one fin. The method further includes covering the second semiconductor layer with a mask layer. In the method, a bottom source/drain region and a top source/drain region are simultaneously grown from the first semiconductor layer and the third semiconductor layer, respectively, and the mask layer is removed from the second semiconductor layer. Top and bottom spacer layers are simultaneously formed on the top and bottom source/drain regions, respectively, and a gate structure is formed on and around the second semiconductor layer.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
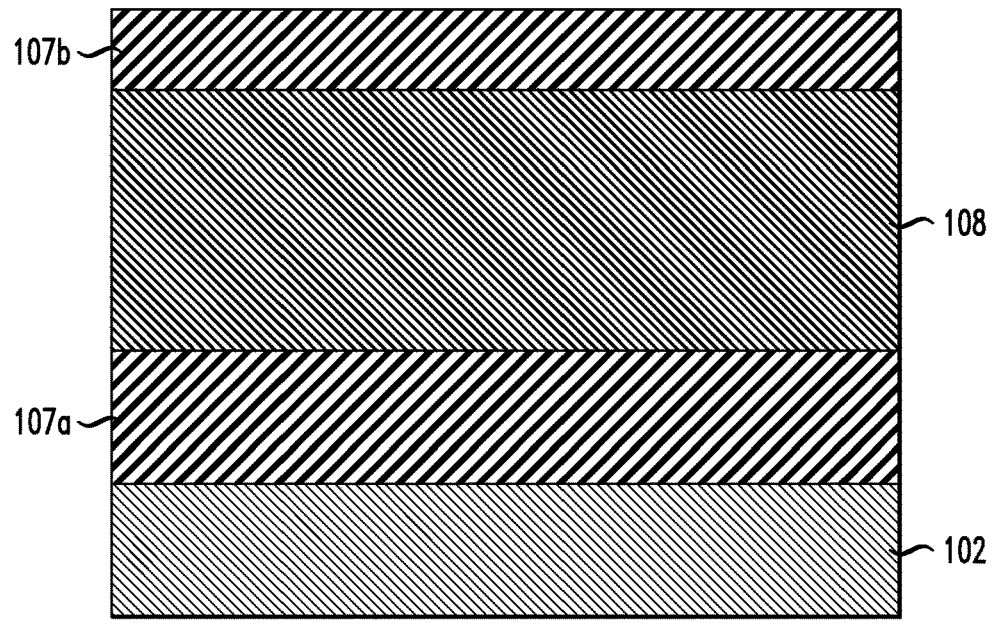
FIG. 1 is a cross-sectional view illustrating growth of a plurality of semiconductor layers on a substrate in a method of manufacturing a semiconductor device, according to an exemplary embodiment of the present invention.

Exemplary embodiments of the invention will now be discussed in further detail with regard to semiconductor devices and methods of manufacturing same and, in particular, to VFET devices manufactured based on a relationship between critical temperature for silicon germanium to silicon oxide conversion and germanium concentration in a silicon germanium layer.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Embodiments of the present invention correspond to methods of fabricating and structures for VFETs, which allow for simultaneous formation of top and bottom source/drain regions and simultaneous formation of top and bottom spacers. In accordance with embodiments of the present invention, recessed gate structures including, for example, a high-k dielectric and a gate conductor, are self-aligned with previously formed top source/drain regions. In addition, top and bottom spacers formed around epitaxially grown source/drain regions reduce parasitic capacitance. Embodiments of the present invention also provide a source/drain contact having a larger volume than conventional structures, and consequently lower resistance.

FIG. 1 is a cross-sectional view illustrating growth of a plurality of semiconductor layers on a substrate in a method of manufacturing a semiconductor device, according to an exemplary embodiment of the present invention. Referring to FIG. 1, semiconductor layers 107a, 108 and 107b are epitaxially grown on a semiconductor substrate 102. In accordance with an embodiment of the present invention, the substrate 102 comprises, a semiconductor material including, but not necessarily limited to, silicon (Si), silicon carbide (SiC), Si:C (carbon doped silicon), a II-V or III-V compound semiconductor or other like semiconductor. In addition, multiple layers of the semiconductor materials can be used as the semiconductor material of the substrate 102. In accordance with an embodiment of the present invention, the semiconductor layers 107a, 108 and 107b each comprise a semiconductor material including, but not necessarily limited to, silicon germanium (SiGe) or other semiconductor material including germanium. The semiconductor layers 107a and 107b have a different concentration of germanium from semiconductor layer 108. For example, the semiconductor layers 107a and 107b include SiGe with about 20% to about 40% germanium, and the semiconductor layer 108 includes SiGe with a lower concentration of germanium than the semiconductor layers 107a and 107b, for example, about 10% to about 20% germanium. In a non-limiting example, the semiconductor layers 107a and 107b, and 108 respectively comprise SiGe with 40% and 20% germanium, but the embodiments of the present invention are not necessarily limited thereto. In accordance with an embodiment of the present invention, a resulting vertical height (e.g., thickness) of the semiconductor layer 107a after epitaxial growth is about 20 nm-about 60 nm, a resulting vertical height (e.g., thickness) of the semiconductor layer 108 after epitaxial growth is about 15 nm-about 40 nm, and a resulting vertical height (e.g., thickness) of the semiconductor layer 107b after epitaxial growth is about 5 nm-about 20 nm.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 2:
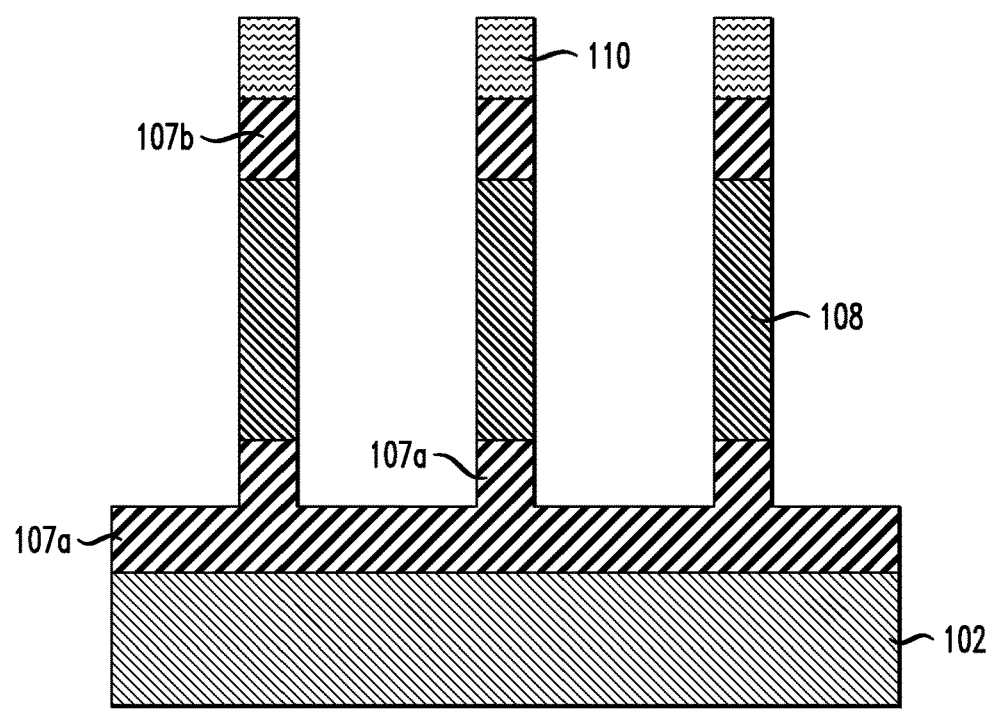
FIG. 2 is a cross-sectional view illustrating fin formation in a method of manufacturing a semiconductor device, according to an exemplary embodiment of the present invention.

FIG. 2 is a cross-sectional view illustrating fin formation in a method of manufacturing a semiconductor device, according to an exemplary embodiment of the present invention. Referring to FIG. 2, the layers 107a, 108 and 107b on the substrate 102 are patterned into a plurality of fins including of portions of the layers 107a, 108 and 107b, which are each under a hardmask layer 110. A portion of the layer 107a is not patterned into fins and remains on the substrate 102. For ease of explanation, three fins are shown in FIG. 2. However, the embodiments of the present invention are not necessarily limited thereto, and the layers 107a, 108 and 107b can be patterned into more or less than three fins.

According to an embodiment, the hardmasks 110 including, for example, a dielectric material, such as silicon nitride (SiN) or a combination of multiple materials, are formed on the portions of the blanket layers 107a, 108 and 107b that are to be formed into the fins. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (RIE) processes. As a result, the spacers will have half the pitch of the mandrel. In other words, the pattern is transferred from a lithography-defined mandrel to spacers, where the pattern density is doubled. The spacer pattern can be used as the hard mask to form the fins by RIE processes. Alternatively, fin patterning can be done by any other suitable patterning technique, including but not limited to, lithography (e.g., extreme ultraviolet (EUV)) in conjunction with ME, self-aligned double patterning (SADP), self-aligned multiple patterning (SAMP), and/or self-aligned quadruple patterning (SAQP)).

Figure 3:
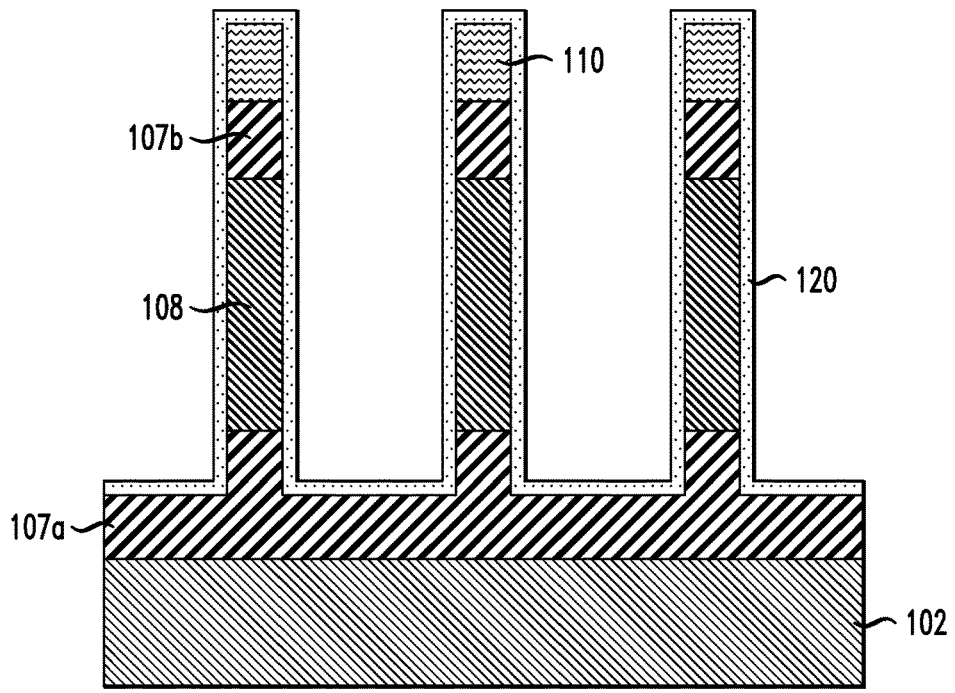
FIG. 3 is a cross-sectional view illustrating a first germanium oxide deposition in a method of manufacturing a semiconductor device, according to an exemplary embodiment of the present invention.

FIG. 3 is a cross-sectional view illustrating a first germanium oxide deposition in a method of manufacturing a semiconductor device, according to an exemplary embodiment of the present invention. Referring to FIG. 3, a first germanium oxide ($GeO_2$) layer 120 is deposited using, for example, atomic layer deposition (ALD) or other conformal deposition process, on the structure from FIG. 2, including on the stacked structures including the remaining portions of layers 107a, 108 and 107b, on the hardmask layer 110, and on the exposed portions of the unpatterned portions of the layer 107a on the substrate 102. In a non-limiting embodiment, a thickness of the $GeO_2$ layer 120 can be in the range of about 2 nm-about 6 nm.

Figure 4:
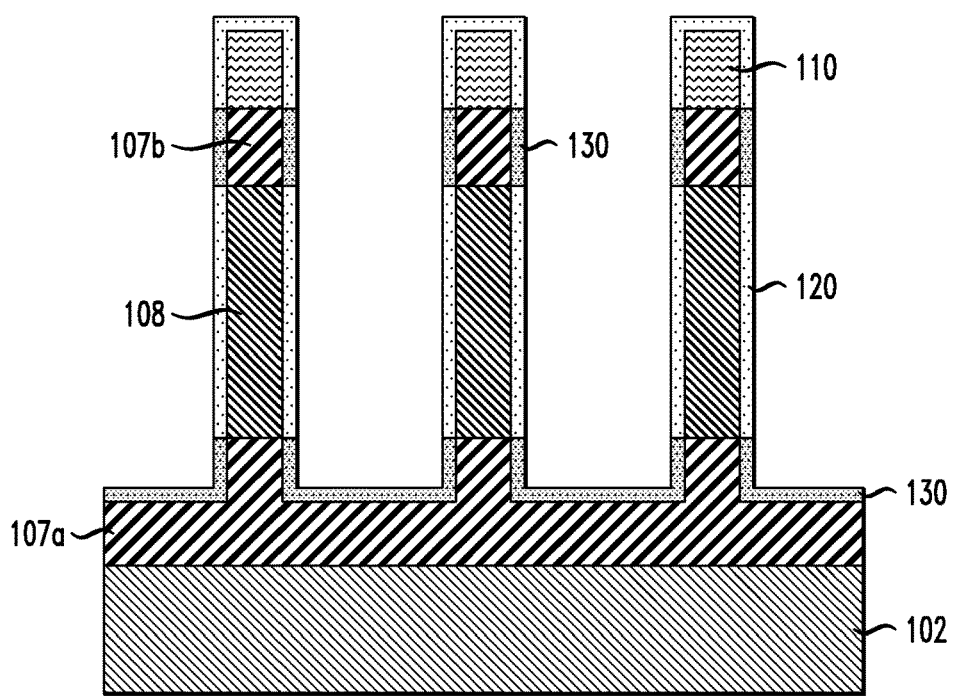
FIG. 4 is a cross-sectional view illustrating conversion of part of the first germanium oxide into a first oxide mask layer in a method of manufacturing a semiconductor device, according to an exemplary embodiment of the present invention.

FIG. 4 is a cross-sectional view illustrating conversion of part of the first germanium oxide into a first oxide mask layer in a method of manufacturing a semiconductor device, according to an exemplary embodiment of the present invention. Referring to FIG. 4, after deposition of the $GeO_2$ layer 120, a thermal annealing process is performed in, for example, nitrogen ($N_2$), argon (Ar), helium (He), xenon (Xe), and/or hydrogen ($H_2$). The temperature at which the thermal annealing process is performed and the germanium concentration of each of the semiconductor layers 107a, 108 and 107b control whether a mask layer is formed on the semiconductor layers 107a, 108 and 107b. In accordance with an embodiment of the present invention, the required annealing temperature to convert a $GeO_2$ layer (e.g., $GeO_2$ layer 120) on SiGe layers 107a, 108 and 107b to, for example, a silicon oxide layer (e.g., layer 130) is inversely proportional to the germanium concentration in the SiGe semiconductor layers 107a, 108 and 107b. In other words, as the concentration of germanium in SiGe decreases, the temperature required to convert the $GeO_2$ layer to the mask layer increases. According to a non-limiting embodiment, for respective germanium concentration ranges of about 10% to about 20%, and about 20% to about 40%, the corresponding annealing temperature ranges to permit conversion to silicon oxide are about 650° C. to about 750° C., and about 550° C. to about 650° C., respectively.

Referring back to FIG. 4, the annealing process is controlled so that the first oxide mask layer 130 is selectively formed on the lower semiconductor and upper semiconductor layers 107a and 107b, but not on the semiconductor layer 108. Assume for purposes of illustration that the lower and upper semiconductor layers 107a and 107b comprise SiGe with 40% germanium. In order to selectively form the mask layer 130 on semiconductor layers 107a and 107b, the thermal annealing is performed at a temperature of, for example, about 550° C., so that the mask layer 130 is not formed on the semiconductor layers 108 having SiGe with lower concentrations of germanium. Alternatively, a much thinner mask layer 130 is formed, which can be completely removed from semiconductor layers 108 by etching, while leaving a substantial amount of mask layer on layers 107a and 107b.

As a result, the thermal annealing process results in the conversion of the $GeO_2$ layer 120 into the layers 130 on the layers 107a and 107b, which, in this example, comprise SiGe with a germanium concentration of 40%. The layers 130 comprise silicon oxide ($SiO_x$), where x is, for example, 2 in the case of silicon dioxide ($SiO_2$), or 1.99 or 2.01. For ease of explanation, the disclosure will refer to the layers 130 as $SiO_2$ layers. It is to be understood that the germanium concentrations of the layers 107a, 108 and 107b may vary, and the annealing process conditions (e.g., temperature) may be adjusted to ensure selective formation of the $SiO_2$ layers on the desired semiconductor layers 107a, 108 or 107b.

As can be seen in FIG. 4, the thermal annealing process does not cause the $GeO_2$ layer 120 on the SiGe layers 108, and on the hardmask layer 110 (e.g., SiN) to be converted into $SiO_2$.

Figure 5:
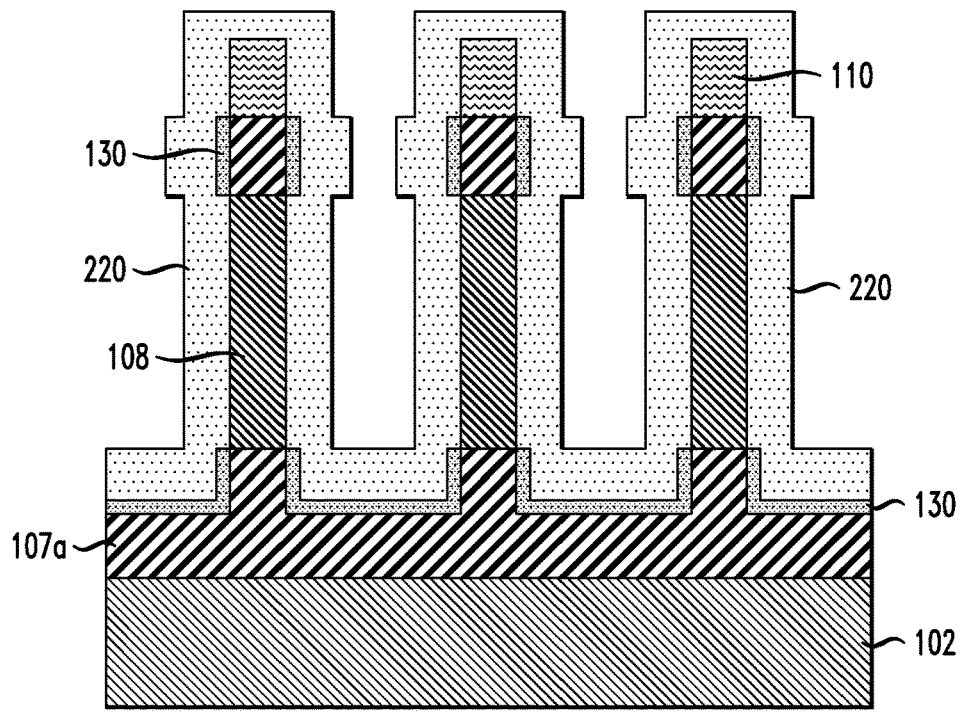
FIG. 5 is a cross-sectional view illustrating removal of unreacted portions of the first germanium oxide and a second germanium oxide deposition in a method of manufacturing a semiconductor device, according to an exemplary embodiment of the present invention.

FIG. 5 is a cross-sectional view illustrating removal of unreacted portions of the first germanium oxide and a second germanium oxide deposition in a method of manufacturing a semiconductor device, according to an exemplary embodiment of the present invention. Referring to FIG. 5, the unreacted portions of the first $GeO_2$ layer 120 are water soluble, and are removed using, for example, a water based agent, such as, for example, deionized (DI) water. The unreacted portions of the $GeO_2$ layer 120 are removed from the stacked structures including the hardmask layers 110, and the layers 108.

After removal of the unreacted portions of the $GeO_2$ layer 120, second germanium oxide ($GeO_2$) layer 220 is deposited using, for example, ALD or other conformal deposition process, on the stacked structures including the layers 107a, 108 and 107b and the hardmask layer 110, on the $SiO_2$ layers 130 and on the exposed portions of the unpatterned portions of the layer 107a on the substrate 102. In a non-limiting embodiment, a thickness of the second $GeO_2$ layer 220 can be in the range of about 5 nm-about 15 nm, which is thicker than the first $GeO_2$ layer 120. As can be seen portions of the second $GeO_2$ layer 220 formed on the $SiO_2$ layers 130 extend further outward than portions formed, for example, directly on the fins and/or hardmasks 110.

Figure 6:
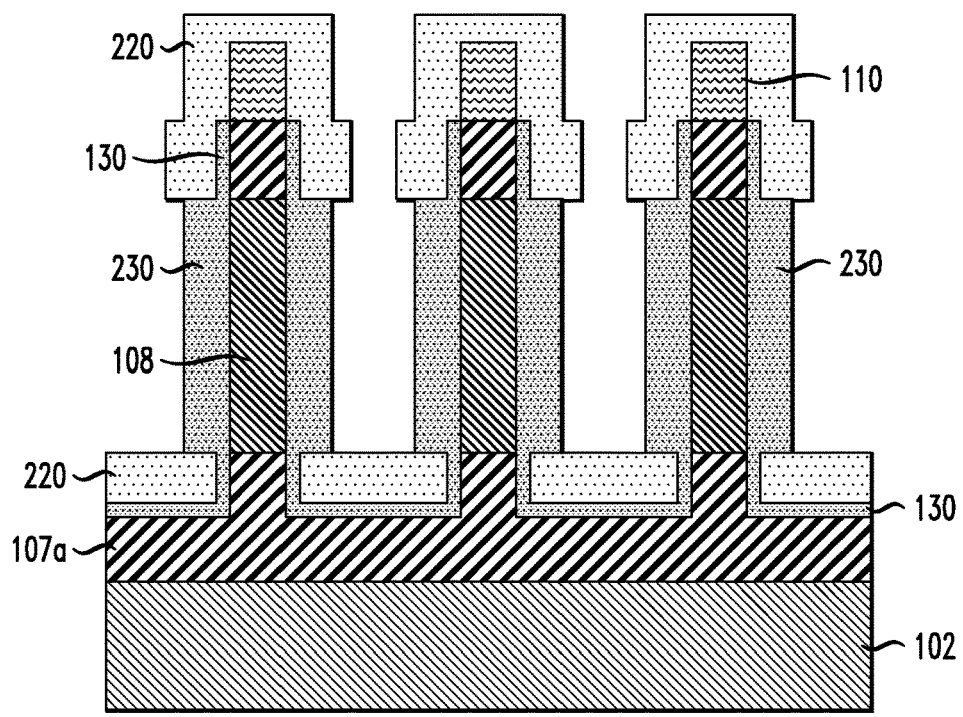
FIG. 6 is a cross-sectional view illustrating conversion of part of the second germanium oxide into a second oxide mask layer in a method of manufacturing a semiconductor device, according to an exemplary embodiment of the present invention.

FIG. 6 is a cross-sectional view illustrating conversion of part of the second germanium oxide into a second oxide mask layer in a method of manufacturing a semiconductor device, according to an exemplary embodiment of the present invention. Referring to FIG. 6, after deposition of the second $GeO_2$ layer 220, a thermal annealing process is performed in, for example, $N_2$, Ar, He, Xe, and/or $H_2$. As noted above, the temperature at which the thermal annealing process is performed and the germanium concentration of each of the semiconductor layers 107a, 108 and 107b control whether a mask layer is formed on the semiconductor layers 107a, 108 and 107b. With respect to FIG. 6, as a result of the annealing process, a second oxide mask layer 230 is selectively formed on the semiconductor layer 108, but not on the semiconductor layers 107a and 107b. The presence of the first oxide mask layers 130 on layers 107a and 107b prevents an additional oxide layer from being formed on the first oxide mask layers 130 because the underlying SiGe mask layers 107a and 107b are masked by the first oxide mask layers 130. In other words, even though the temperature to cause conversion to silicon oxide of the second $GeO_2$ layer 220 on the lower germanium concentration SiGe layers 108 must be higher than that to cause conversion of $GeO_2$ to silicon oxide on higher concentration SiGe layers 107a and 107b, the presence of the first oxide mask layers 130 on layers 107a and 107b prevents an additional $SiO_2$ layer from being formed.

Assume for purposes of illustration that the semiconductor layer 108 comprises SiGe with 20% germanium. In order to form the mask layer 230 on semiconductor layer 108, the thermal annealing is performed at a temperature of, for example, about 650° C. Since the lower and upper semiconductor layers 107a and 107b having SiGe with a higher concentration of germanium than that of the layers 108 are masked with the $SiO_2$ layers 130 from the previous annealing process, the portion of the second $GeO_2$ layer 220 formed on the $SiO_2$ layers 130 will not react during this next annealing process. As a result, the thermal annealing process in connection with FIG. 6 results in the conversion of the second $GeO_2$ layer 220 into the layers 230 on the layers 108, which, in this example, comprise SiGe with a germanium concentration of 20%. Like the layers 130, the layers 230 comprise silicon oxide ($SiO_x$), where x is, for example, 2 in the case of silicon dioxide ($SiO_2$), or 1.99 or 2.01. For ease of explanation, the disclosure will refer to the layers 230 as $SiO_2$ layers. The resulting $SiO_2$ layers 230 are thicker (e.g., horizontal thickness) than the $SiO_2$ layers 130.

As can be seen in FIG. 6, the thermal annealing process does not cause the second $GeO_2$ layer 220 on the SiGe layers 107a and 107b (including on $SiO_2$ layers 130), and on the hardmask layers 110 to be converted into $SiO_2$.

Figure 7:
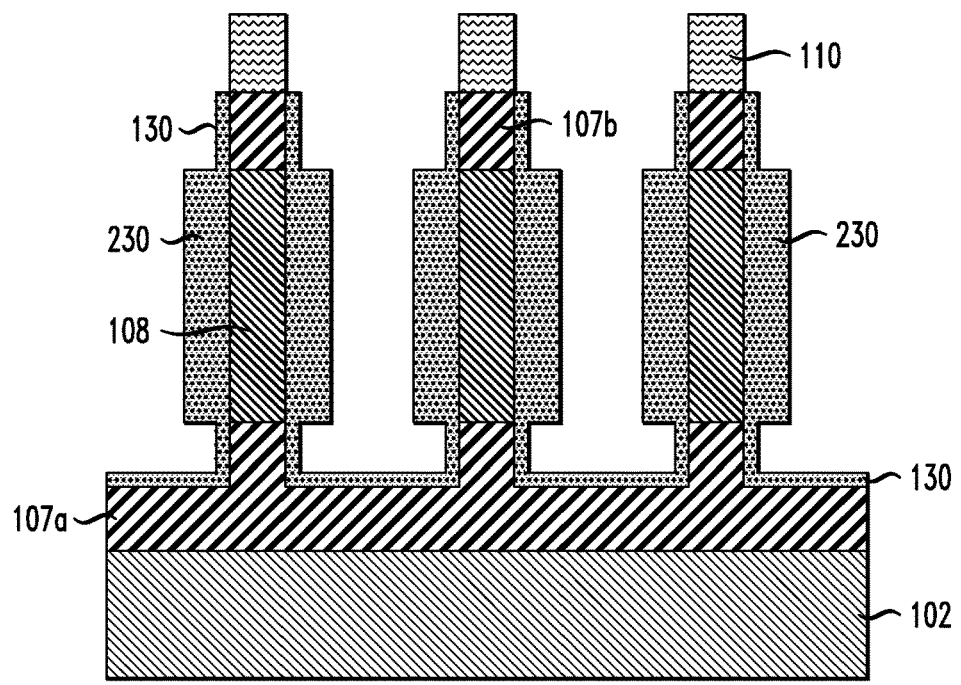
FIG. 7 is a cross-sectional view illustrating removal of unreacted portions of the second germanium oxide in a method of manufacturing a semiconductor device, according to an exemplary embodiment of the present invention.

FIG. 7 is a cross-sectional view illustrating removal of unreacted portions of the second germanium oxide in a method of manufacturing a semiconductor device, according to an exemplary embodiment of the present invention. Referring to FIG. 7, the unreacted portions of the second $GeO_2$ layer 220 are water soluble, and are removed using, for example, a water based agent, such as, for example, DI water. The unreacted portions of the $GeO_2$ layer 220 are removed from the stacked structures including the hardmask layers 110, and the layers 107a and 107b. The unreacted portions of the $GeO_2$ layer 220 are also removed from the unpatterned portions of the layer 107a on the semiconductor substrate 102.

According to an embodiment of the present invention, during the thermal annealing processes, the annealing conditions cause the Si in the SiGe portions 107a, 108 and 107b to bond with the oxygen in the $GeO_2$ layers 120 or 220 to form $SiO_2$ layers 130 or 230. The Si in the SiGe portions 107a, 108 and 107b does not bond with the Ge in the respective $GeO_2$ layers 120 and 220. As a result, the Ge from the $GeO_2$ layers 120 and 220 is driven into the inner portions of the layers 107a and 107b, and 108, respectively, and the Si from the inner portions of the layers 107a, 107b and 108 is driven out of the layers 107a, 107b and 108 to bond with the oxygen, which forms higher Ge % SiGe portions 107a, 107b and 108. The resulting Ge concentration in the SiGe portions 107a, 107b and 108 after thermal annealing is higher than the Ge concentration in those layers prior to the thermal annealing.

In accordance with embodiments of the present invention, the annealing can be performed in an environment including nitrogen, argon, xenon, helium, hydrogen, or any suitable combination of those gases, for a time period of 1 millisecond to 30 minutes. The anneal can be done by rapid thermal annealing (RTP), furnace annealing, flash annealing, laser annealing, spike annealing, or any suitable combination of those techniques.

In accordance with an embodiment of the present invention, the annealing may be carried out for a variable period of time. In one example, the annealing process is carried out for a time period from about 0.5 seconds to 2 seconds, depending on temperature and germanium concentration in the SiGe layers 107a, 108 and 107b. The annealing process may be carried out at a single targeted temperature, or at various ramp and soak cycles using various ramp rates and soak times.

By way of further explanation, in accordance with an embodiment of the present invention, the Si atoms in the SiGe portions 107a, 108 and 107b bond with available oxygen from the respective $GeO_2$ layers 120 and 220 during the annealing processes to form the $SiO_2$ layers 130 and 230.

Figure 8:
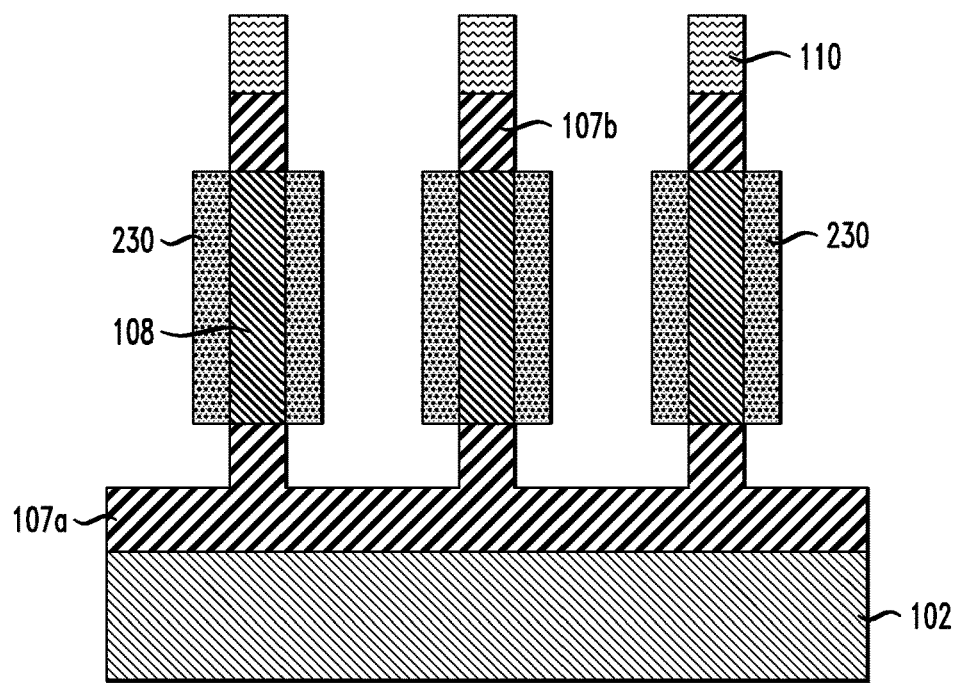
FIG. 8 is a cross-sectional view illustrating removal of the first oxide mask layer and lateral recessing of the second oxide mask layer in a method of manufacturing a semiconductor device, according to an exemplary embodiment of the present invention.

FIG. 8 is a cross-sectional view illustrating removal of the first oxide mask layer and lateral recessing of the second oxide mask layer in a method of manufacturing a semiconductor device, according to an exemplary embodiment of the present invention. Referring to FIG. 8, the thinner $SiO_2$ layers 130 are removed to expose the layers 107a and 107b having, for example, SiGe with 40% germanium concentration. The removal of the Sift layers 130 is performed using a wet or dry etch process including, for example, diluted hydrofluoric (HF) acid solution. The etch process reduces a thickness of the remaining $SiO_2$ layers 230, which were thicker than the $SiO_2$ layers 130. For example, the etch process reduces a thickness of the remaining $SiO_2$ layers 230 by about half if a thickness of the $SiO_2$ layers 230 was about twice the thickness of the $SiO_2$ layers 130.

Figure 9:
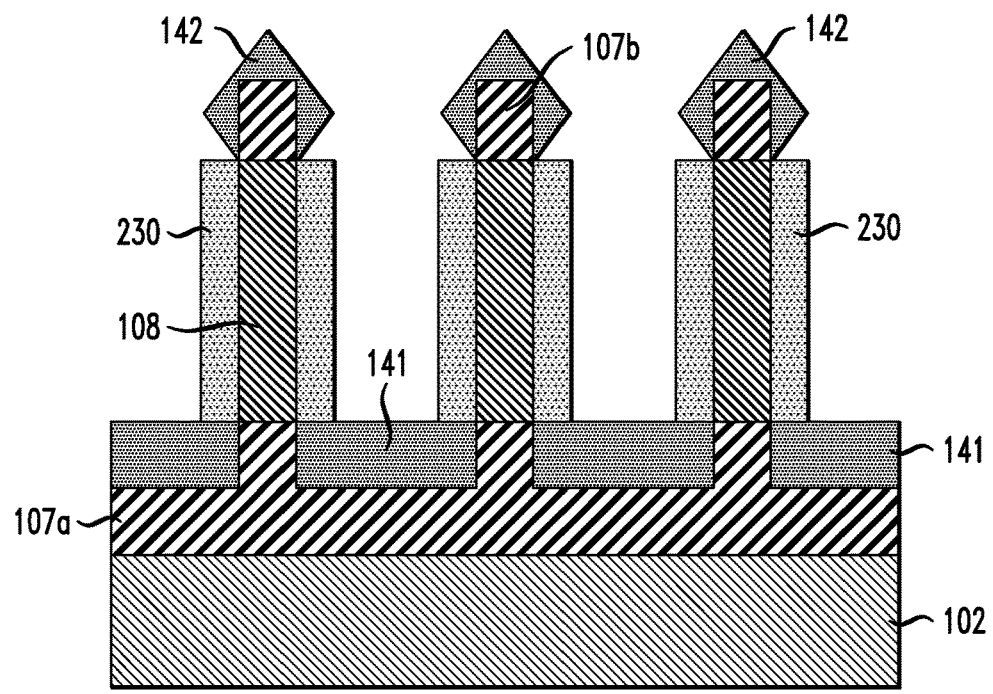
FIG. 9 is a cross-sectional view illustrating fin hardmask removal and simultaneous growth of bottom and top source/drain regions in a method of manufacturing a semiconductor device, according to an exemplary embodiment of the present invention.

FIG. 9 is a cross-sectional view illustrating fin hardmask removal and simultaneous growth of bottom and top source/drain regions in a method of manufacturing a semiconductor device, according to an exemplary embodiment of the present invention. Referring to FIG. 9, the hardmasks 110 are selectively removed with respect to the SiGe layers 107a and 107b, and the $SiO_2$ layers 230, using for example, a selective etch process. The selective etch process can include, for example, a wet etch process containing phosphoric acid.

Following the fin hardmask removal, with the semiconductor layers 108 protected by the remaining $SiO_2$ layers 230, bottom and top source/drain regions 141 and 142 are simultaneously epitaxially grown in an epitaxial growth process from the semiconductor layers (e.g., SiGe) 107a and 107b. The epitaxially grown bottom and top source/drain regions 141 and 142 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1 \times 10^{18}/cm^3$ to $3 \times 10^{21}/cm^3$. Since the semiconductor layers 108 are covered by the remaining $SiO_2$ layers 230 during epitaxial growth, the bottom and top source/drain regions 141 and 142 can be epitaxially grown at the same time. In accordance with an embodiment of the present invention, the bottom and top source/drain regions 141 and 142 can also be doped at the same time. The bottom and top source/drain regions 141 and 142 have the same or similar germanium concentration as the semiconductor layers 107a and 107b from which they are grown, with the addition of a dopant. Example Ge % in source/drain regions 141 and 142 is about 40%-about 85%.

Figure 10:
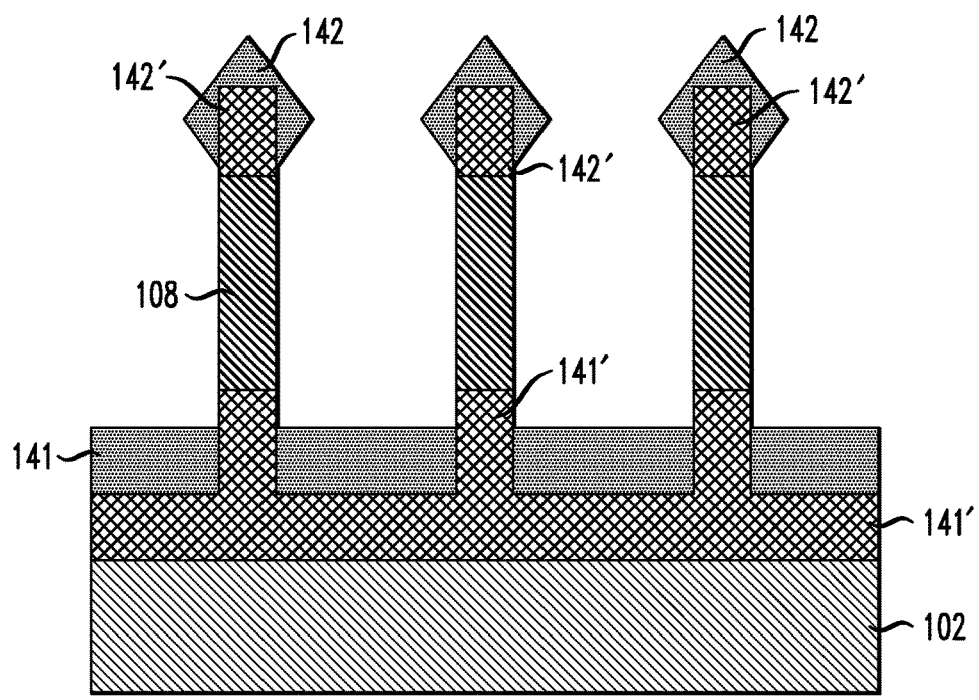
FIG. 10 is a cross-sectional view illustrating removal of the second oxide mask layer and junction annealing in a method of manufacturing a semiconductor device, according to an exemplary embodiment of the present invention.

FIG. 10 is a cross-sectional view illustrating removal of the second oxide mask layer and junction annealing in a method of manufacturing a semiconductor device, according to an exemplary embodiment of the present invention. Referring to FIG. 10, the SiO$_2$ layers 230 are removed from the layers 108. The removal of the Sift layers 230 is performed using a wet or dry etch process including, for example, diluted HF solution.

As can be seen from FIG. 10, junction annealing is performed. The bottom junctions 141' between the bottom source/drain regions 141 and the fins, and the top junctions 142' between the top source/drain regions 142 and the fins, are formed by an annealing process. The annealing process causes dopant diffusion into the layers 107a and parts of the layers 108 from the bottom source/drain regions 141, and dopant diffusion into the layers 107b and parts of the layers 108 from the top source/drain regions 142. The resulting bottom and top junctions 141' and 142' include the portions formerly labeled as 107a and 107b, and parts of layer 108, which retain the same shape and include SiGe, but after diffusion also include the diffused dopant. A doping concentration can be higher at areas of the fins closer to the top and bottom source/drain regions 141 and 142 than at areas of the fins farther away from the source/drain regions 141 and 142. The annealing process can be, for example, a drive-in annealing process performed at temperatures in the range of, for example, about 800° C. to 1300° C. and for durations in the range of, for example, about 0.01 seconds to 10 minutes. The anneal can be done by rapid thermal annealing (RTP), furnace annealing, flash annealing, laser annealing, spike annealing, or any suitable combination of those techniques.

Figure 11:
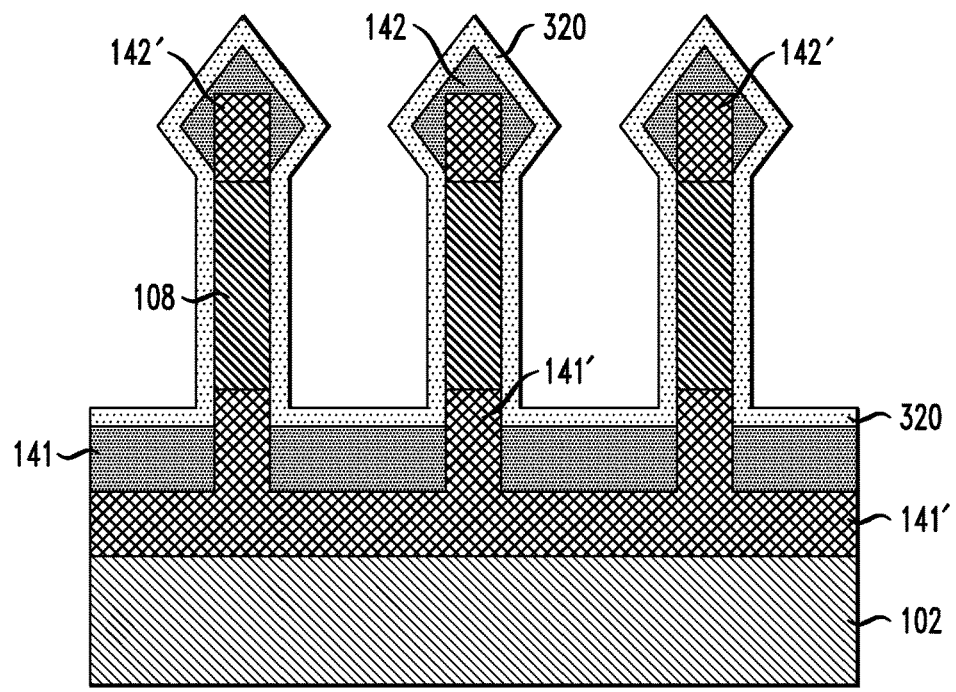
FIG. 11 is a cross-sectional view illustrating a third germanium oxide deposition in a method of manufacturing a semiconductor device, according to an exemplary embodiment of the present invention.

FIG. 11 is a cross-sectional view illustrating a third germanium oxide deposition in a method of manufacturing a semiconductor device, according to an exemplary embodiment of the present invention. Referring to FIG. 11, a third GeO$_2$ layer 320 is deposited using, for example, atomic layer deposition (ALD) or other conformal deposition process, on the structure from FIG. 10, including on the stacked structures including the remaining portions of layers 108, the top and bottom source/drain regions 142 and 141, and the top and bottom junctions 142' and 141'. In a non-limiting embodiment, a thickness of the third GeO$_2$ layer 320 can be in the range of about 3 nm-about 8 nm.

Figure 12:
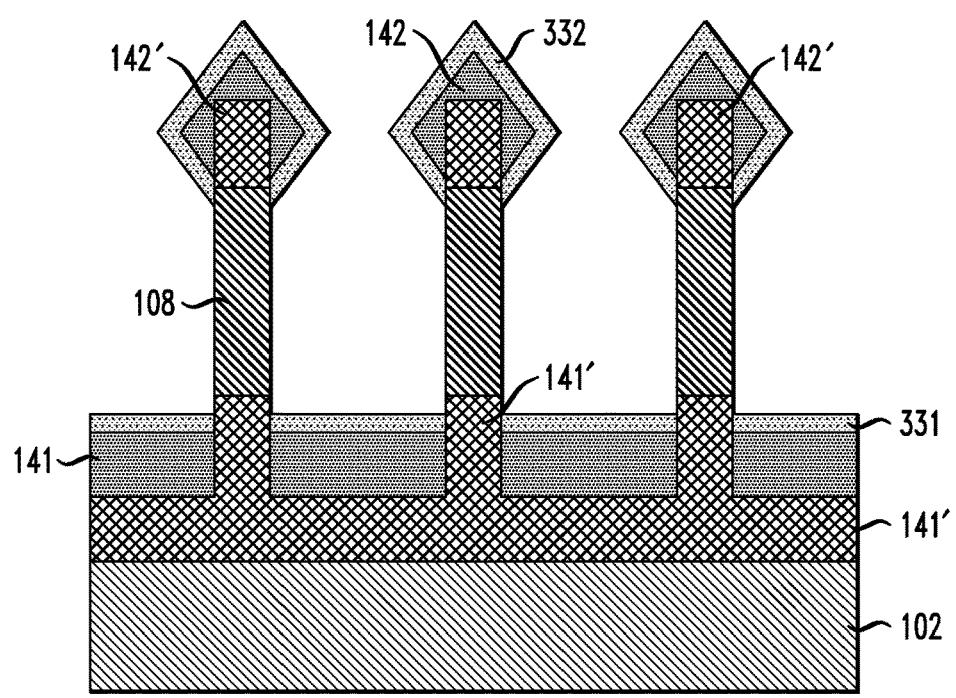
FIG. 12 is a cross-sectional view illustrating conversion of part of the third germanium oxide into top and bottom spacer layers and removal of unreacted portions of the third germanium oxide in a method of manufacturing a semiconductor device, according to an exemplary embodiment of the present invention.

FIG. 12 is a cross-sectional view illustrating conversion of part of the third germanium oxide into top and bottom spacer layers and removal of unreacted portions of the third germanium oxide in a method of manufacturing a semiconductor device, according to an exemplary embodiment of the present invention. Referring to FIG. 12, a thermal annealing process to convert the third GeO$_2$ layer 320 to silicon oxide is controlled so that top and bottom spacer layers 332 and 331 are simultaneously selectively formed on the top and bottom source/drain regions 142 and 141, which have the same or similar germanium concentration to layers 107a and 107b prior to the junction annealing. With the exception of areas that are closely adjacent to the top and bottom source/drain regions 142 and 141, the top and bottom spacer layers 332 and 331 are not formed on the semiconductor layers 108 or junction annealed portions of the semiconductor layers 108. Assume for purposes of illustration that the top and bottom source/drain regions 142 and 141 comprise SiGe with 50% germanium. In order to selectively form the top and bottom spacer layers 332 and 331 on the top and bottom source/drain regions 142 and 141, the thermal annealing is performed at a temperature of, for example, about 500° C., so that the top and bottom spacer layers 332 and 331 are not formed on the semiconductor layers 108 or junction annealed portions of the semiconductor layers 108 having SiGe with lower concentrations of germanium. As a result, the thermal annealing process results in the conversion of the GeO$_2$ layer 320 into the layers 332 and 331 on the top and bottom source/drain regions 142 and 141b, which, in this example, comprise SiGe with a germanium concentration of 50%. The layers 331 and 332 comprise silicon oxide (SiOx), where x is, for example, 2 in the case of silicon dioxide (SiO$_2$), or 1.99 or 2.01. For ease of explanation, the disclosure will refer to the layers 331 and 332 as SiO$_2$ layers. It is to be understood that the germanium concentrations of the top and bottom source/drain regions 142 and 141, and of the semiconductor layers 108 or junction annealed portions of the semiconductor layers 108, may vary, and the annealing process conditions (e.g., temperature) may be adjusted to ensure selective formation of the SiO$_2$ top and bottom spacer layers 332 and 331 on the desired top and bottom source/drain regions 142 and 141. The annealing process and conditions to convert the third GeO$_2$ layers 320 to the top and bottom spacers 332 and 331 are the same or similar to the annealing process and conditions described above in connection with converting first or second GeO$_2$ layers 120 or 220 to the SiO$_2$ layers 130 or 230.

The unreacted GeO$_2$ layers 320 on the semiconductor layers 108 or junction annealed portions of the semiconductor layers 108 are water soluble, and are removed using, for example, a water based agent, such as, for example, DI water. The unreacted portions of the GeO$_2$ layer 320 are removed from the stacked structures including the semiconductor layers 108 or junction annealed portions of the semiconductor layers 108.

Figure 13:
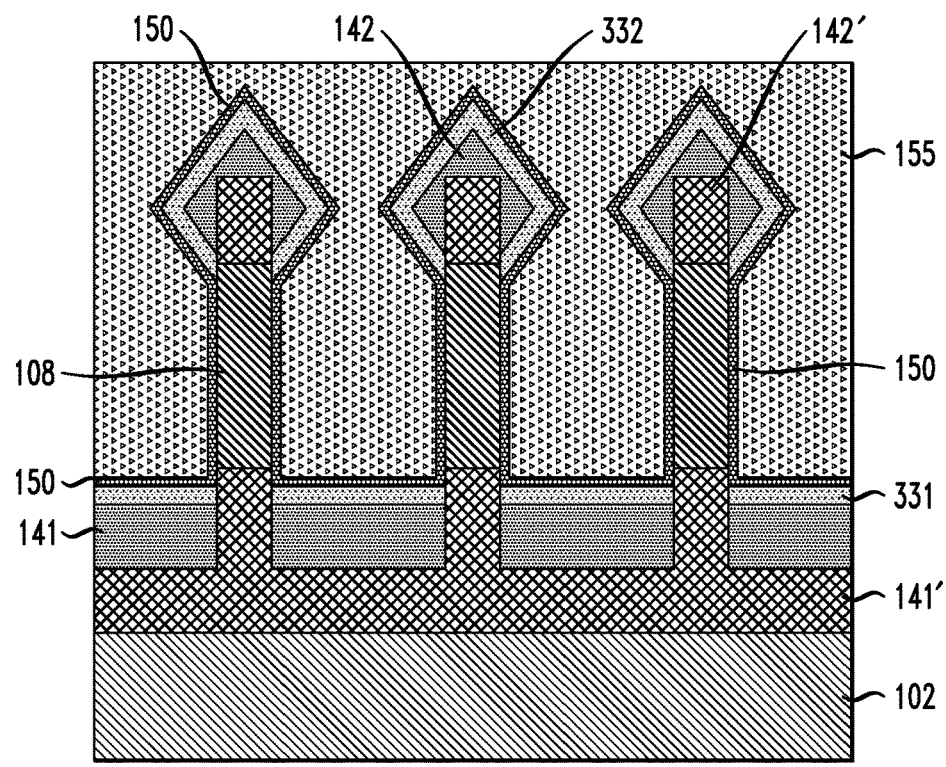
FIG. 13 is a cross-sectional view illustrating gate structure formation in a method of manufacturing a semiconductor device, according to an exemplary embodiment of the present invention.

FIG. 13 is a cross-sectional view illustrating gate structure formation in a method of manufacturing a semiconductor device, according to an exemplary embodiment of the present invention. Referring to FIG. 13, the gate structures include gate layers 155 and dielectric layers 150. The dielectric layers 150 include, for example, a high-K material including but not necessarily limited to, HfO$_2$ (hafnium oxide), ZrO$_2$ (zirconium dioxide), hafnium zirconium oxide Al$_2$O$_3$ (aluminum oxide), and Ta$_2$O$_5$ (tantalum pentoxide). The gate layers 155 include, for example, a work-function metal (WFM) layer, including but not necessarily limited to, for a p-type FET (pFET), titanium nitride (TiN), tantalum nitride (TaN) or ruthenium (Ru), and for an n-type FET (nFET), TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. The gate layers 155 further include a gate conductor including, but not limited to amorphous silicon (a-Si), or metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

The gate structures are deposited on the spacers 331 and 332 on the source/drain regions 141 and 142 and on and around the fins including the semiconductor layers 108 and junction annealed portions of the semiconductor layers 108. The gate structures are deposited using, for example, deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), sputtering, and/or plating, followed by a planarization process, such as, for example, chemical mechanical planarization (CMP).

Figure 14:
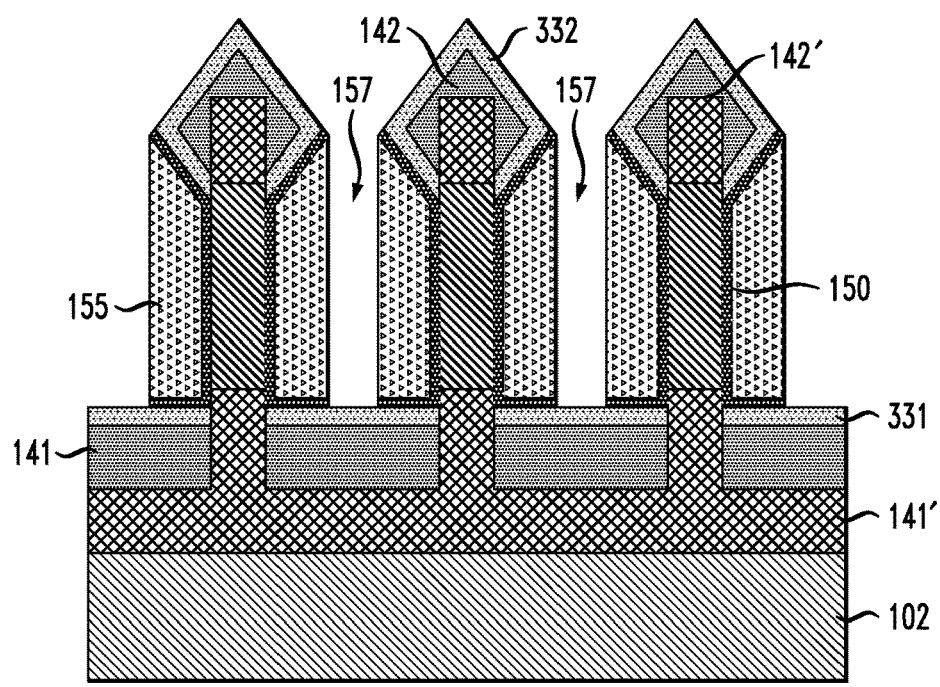
FIG. 14 is a cross-sectional view illustrating gate structure recessing in a method of manufacturing a semiconductor device, according to an exemplary embodiment of the present invention.

FIG. 14 is a cross-sectional view illustrating gate structure recessing in a method of manufacturing a semiconductor device, according to an exemplary embodiment of the present invention. Referring to FIG. 14, the gate structures including the gate layers 155 and the dielectric layers 150 are recessed and removed. In some embodiments, the gate recess process comprises a first etch process (e.g., RIE) that etches gate layers 155 selective to the high-K gate dielectric 150, and a second gate dielectric etch process (e.g., isotropic high-K dielectric etch) to remove the exposed high-K gate dielectric. As can be seen, using the gate structures are selectively etched with respect to the top and bottom spacers 332 and 331, so that the gate structures under the top spacers 332 and the top source/drain regions 142 remain, while the exposed portions of the gate structures are removed. As a result, the remaining portions of the gate structures are self-aligned with the top spacers 332 and the top source/drain regions 142. The gate structures including the gate layers 155 and the dielectric layers 150 are recessed to have upper surfaces with an orientation and size that conform to the spacers 332 on the bottom sides of the top source/drain regions 142. For example, the upper surfaces of the gate structures are parallel to (e.g., sloped at the same angle as) the bottom sides of the top source/drain regions 142 and the spacers 332 on the bottom sides of the top source/drain regions 142. In addition, the gate structures that remain after recessing and removal are aligned under the widest portions of the source/drain regions 142 including the spacers 332 thereon.

Figure 15:
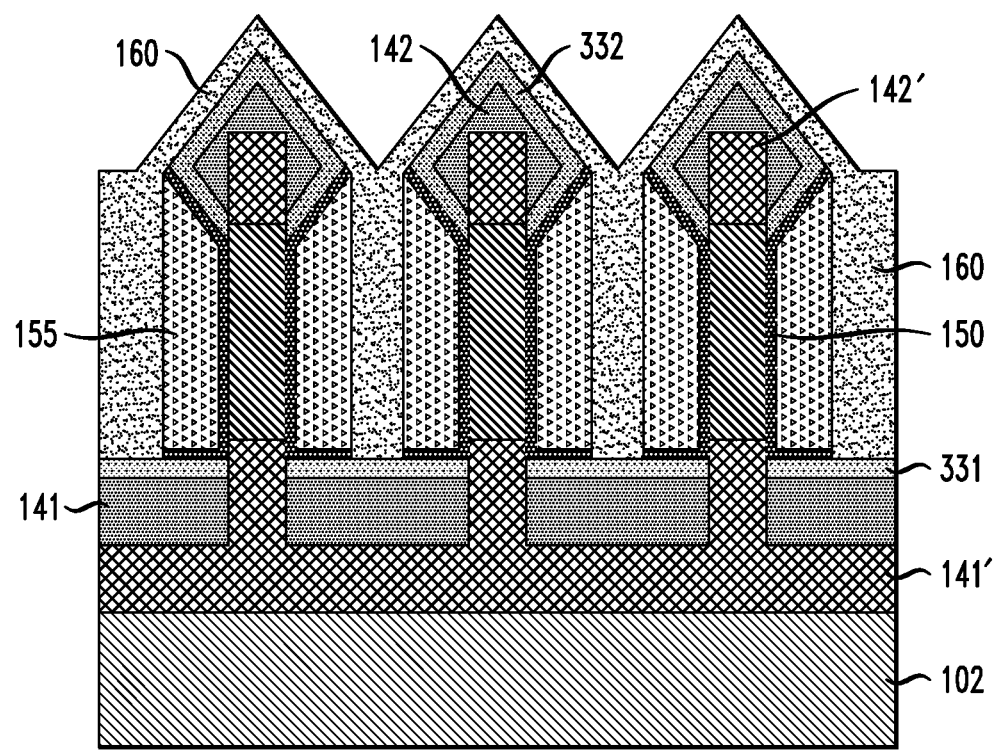
FIG. 15 is a cross-sectional view illustrating gate encapsulation layer deposition in a method of manufacturing a semiconductor device, according to an exemplary embodiment of the present invention.

FIG. 15 is a cross-sectional view illustrating gate encapsulation layer deposition in a method of manufacturing a semiconductor device, according to an exemplary embodiment of the present invention. Referring to FIG. 15, a gate encapsulation layer 160, comprising, for example, a nitride, such as SiN, is deposited on the gate structures including the gate layers 155 and the dielectric layers 150, and on the spacers 332 and 331 using ALD or other conformal deposition technique. The gaps 157 (see FIG. 14) between the gate structures are pinched-off as a result of the deposition of the gate encapsulation layer 160.

Figure 16:
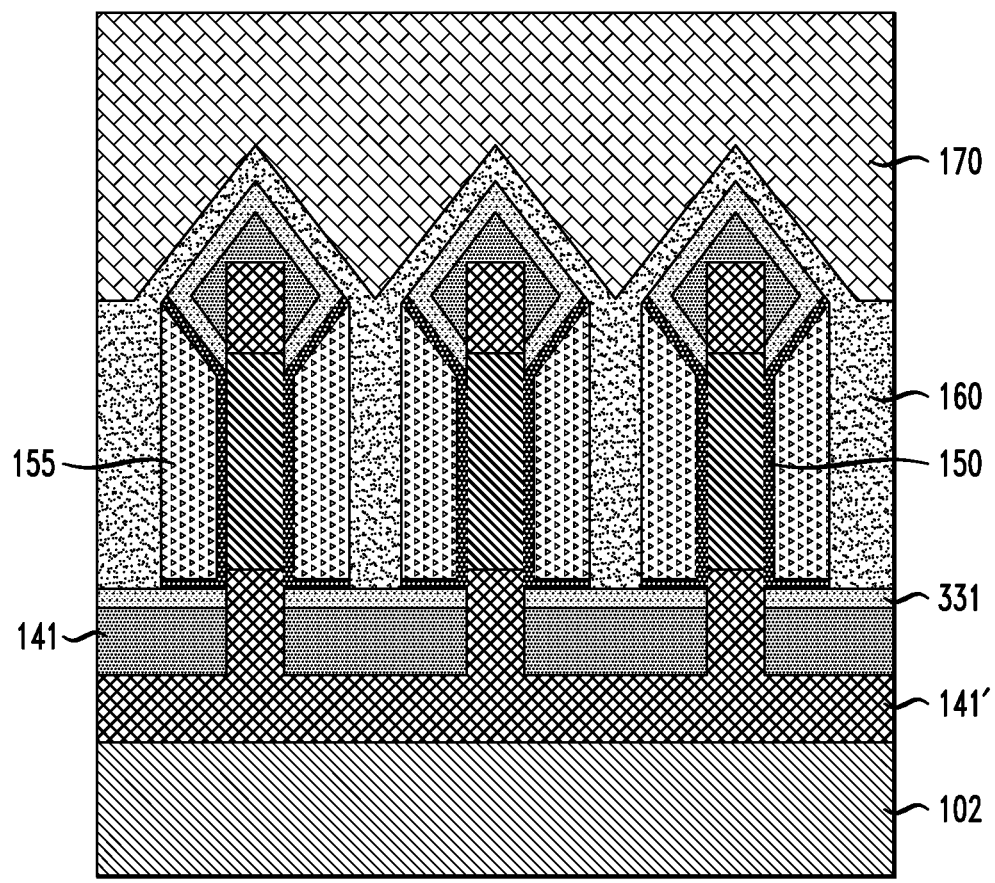
FIG. 16 is a cross-sectional view illustrating inter-level dielectric (ILD) layer deposition in a method of manufacturing a semiconductor device, according to an exemplary embodiment of the present invention.

FIG. 16 is a cross-sectional view illustrating inter-level dielectric (ILD) layer deposition in a method of manufacturing a semiconductor device, according to an exemplary embodiment of the present invention. Referring to FIG. 16, an ILD layer 170 comprising, for example, silicon oxide (SiO$_x$), silicon oxycarbide (SiOC), silicon oxycarbonitride (SiOCN) or some other dielectric, is formed on the exposed portions of the structure including the deposited gate encapsulation layer 160. The ILD layer 170 is deposited using a deposition process, such as, for example, CVD, PECVD, PVD, ALD, MBD, PLD, LSMCD, and/or spin-on coating. The deposited layer is planarized using a planarization process, such as, for example, CMP.

Figure 17:
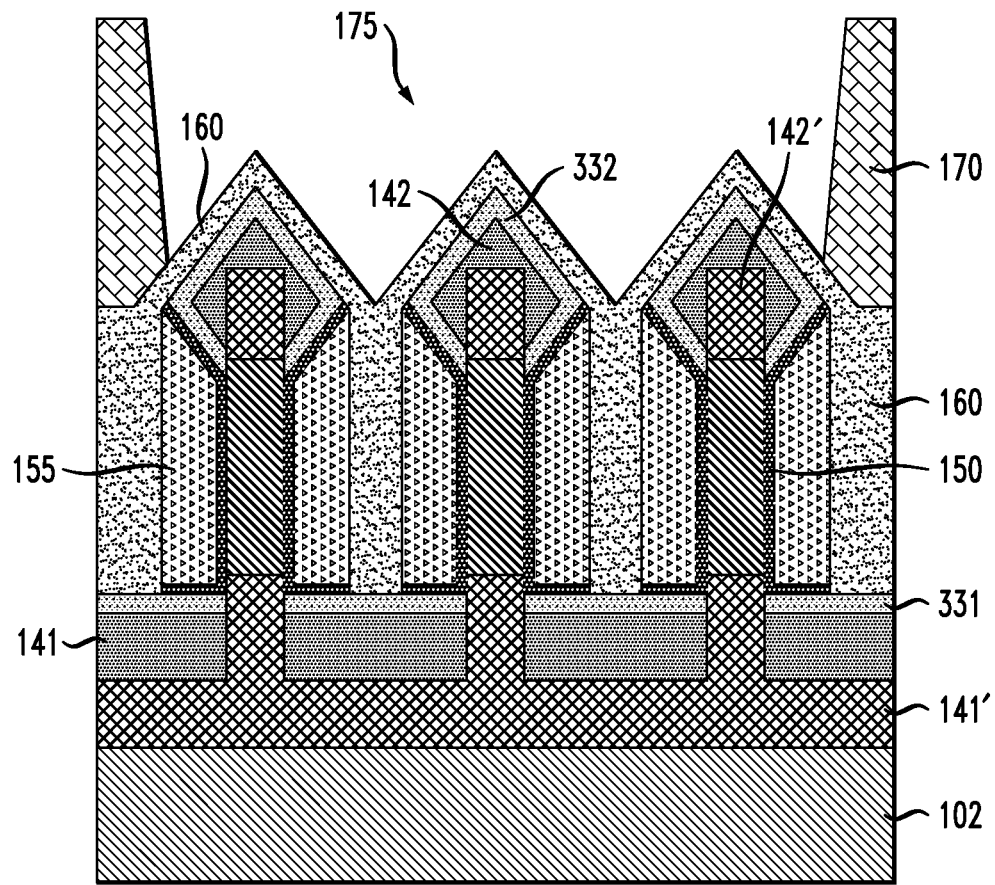
FIG. 17 is a cross-sectional view illustrating patterning of the ILD layer to form an opening for a top source/drain contact in a method of manufacturing a semiconductor device, according to an exemplary embodiment of the present invention.

FIG. 17 is a cross-sectional view illustrating patterning of the ILD layer to form an opening for a top source/drain contact in a method of manufacturing a semiconductor device, according to an exemplary embodiment of the present invention. Referring to FIG. 17, a trench 175 is opened in the ILD layer 170 over the source/drain regions 142 using, for example, lithography followed by ME. According to an embodiment, the etchant is selective with respect to the layer 160. The formation of the trench 175 exposes the encapsulation layer 160 formed on the source/drain regions 142 and in between the gate structures.

Figure 18:
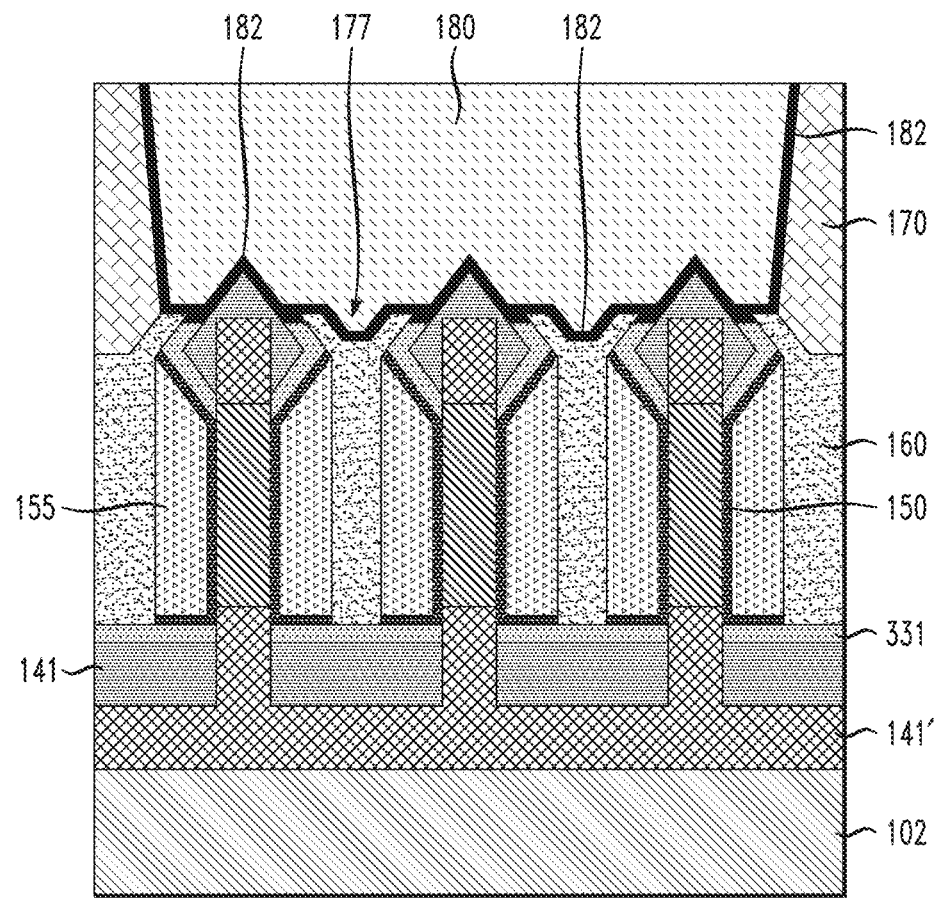
FIG. 18 is a cross-sectional view illustrating removal of portions of the top spacer and gate encapsulation layers and formation of a top source/drain contact in a method of manufacturing a semiconductor device, according to an exemplary embodiment of the present invention.

FIG. 18 is a cross-sectional view illustrating removal of portions of the top spacer and gate encapsulation layers and formation of a top source/drain contact in a method of manufacturing a semiconductor device, according to an exemplary embodiment of the present invention. Referring to FIG. 18, exposed portions of the gate encapsulation layer 160, and then of the top spacer layer 332 in the trench 175 are removed. If the gate encapsulation layer 160 is silicon nitride, it can be removed by a wet etch containing hot phosphoric acid. The top spacer 332 (e.g., silicon oxide) can be removed by a wet etch containing buffered HF or diluted HF. Alternatively, oxide can be removed by a dry etch such as chemical oxide etch. After removal of the portions of the gate encapsulation and top spacer layers 160 and 332, a contact to source/drain regions 142 is formed in the trench 175 by filling the trench 175 with a contact material layer 180, such as, for example, electrically conductive material including, but not necessarily limited to, tungsten, cobalt, zirconium, tantalum, titanium, aluminum, ruthenium, and/or copper. A liner layer 182 including, for example, titanium and/or titanium nitride, may be formed in the trench on the source/drain regions 142, the encapsulation layer 160 and portions of the top spacer layer 332 at the bottom of the trench 175, and on the ILD layer 170 at sides of the trench 175 before filling the trench with the contact material layer 180. The structure including a single contact region (including layers 180 and 182) in one trench 175 to multiple source/drain regions 142, as opposed to multiple contacts in respective trenches to corresponding source/drain regions, increases the area and volume of the contact region, resulting in a lower resistance on the contact region than when a plurality of contacts are used. As shown in FIG. 18, during removal of exposed portions of the gate encapsulation layer 160, divots 177 are formed at the top of the portions of the gate encapsulation layer 160 between the gate structures. The divots 177, which are filled with the contact material and liner layers 180 and 182, further increase the area/volume of the contact region.

Deposition of the contact material and liner layers 180 and 182 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a first semiconductor layer on a semiconductor substrate;
   forming a second semiconductor layer comprising a first concentration of germanium on the first semiconductor layer;

forming a third semiconductor layer on the second semiconductor layer, wherein the first and third semiconductor layers each comprise a concentration of germanium which is greater than the first concentration of germanium;

patterning the first, second and third semiconductor layers into at least one fin;

covering the second semiconductor layer with a mask layer;

simultaneously growing a bottom source/drain region from the first semiconductor layer and a top source/drain region from the third semiconductor layer;

removing the mask layer from the second semiconductor layer; and forming a gate structure on and around the second semiconductor layer;

wherein a portion of the first semiconductor layer remains unpatterned; and wherein covering the second semiconductor layer with the mask layer comprises:

forming a first germanium oxide layer on the first, second and third semiconductor layers of the at least one fin and on the unpatterned portion of the first semiconductor layer;

performing a first annealing process to convert the first germanium oxide layer formed on the first and third semiconductor layers into a first oxide mask layer; and removing remaining portions of the first germanium oxide layer from the at least one fin.

2. The method according to claim 1, wherein covering the second semiconductor layer with the mask layer further comprises:

forming a second germanium oxide layer on the first, second and third semiconductor layers of the at least one fin and on the unpatterned portion of the first semiconductor layer, including on the first oxide mask layer;

performing a second annealing process to convert the second germanium oxide layer formed on the second semiconductor layer into a second oxide mask layer; and removing remaining portions of the second germanium oxide layer from the at least one fin and from the unpatterned portion of the first semiconductor layer, including from the first oxide mask layer.

3. The method according to claim 2, wherein the second germanium oxide layer is thicker than the first germanium oxide layer.

4. The method according to claim 2, wherein the second annealing process is performed at a higher temperature than the first annealing process.

5. The method according to claim 2, wherein the first and second oxide mask layers comprise silicon oxide.

6. The method according to claim 2, wherein the second oxide mask layer is thicker than the first oxide mask layer.

7. The method according to claim 6, wherein covering the second semiconductor layer with the mask layer further comprises removing the first oxide mask layer from the first and third semiconductor layers.

8. The method according to claim 1, further comprising:

forming a second germanium oxide layer on the top and bottom source/drain regions and on the second semiconductor layer.

9. The method according to claim 1, wherein the first, second and third semiconductor layers comprise silicon germanium.

10. The method according to claim 1, further comprising performing a junction annealing process following the simultaneous growing of the bottom and top source/drain regions.

11. A method for manufacturing a semiconductor device, comprising:

forming a first semiconductor layer on a semiconductor substrate;

forming a second semiconductor layer comprising a first concentration of germanium on the first semiconductor layer;

forming a third semiconductor layer on the second semiconductor layer, wherein the first and third semiconductor layers each comprise a concentration of germanium which is greater than the first concentration of germanium;

patterning the first, second and third semiconductor layers into at least one fin;

covering the second semiconductor layer with a mask layer;

simultaneously growing a bottom source/drain region from the first semiconductor layer and a top source/drain region from the third semiconductor layer;

removing the mask layer from the second semiconductor layer;

forming a gate structure on and around the second semiconductor layer;

forming a germanium oxide layer on the top and bottom source/drain regions and on the second semiconductor layer; and performing an annealing process to convert the germanium oxide layer formed on the top and bottom source/drain regions into top and bottom oxide spacer layers.

12. The method according to claim 11, wherein forming the gate structure comprises:

depositing a gate dielectric layer and a gate layer on the top and bottom oxide spacer layers and on the second semiconductor layer; and recessing the gate structure, wherein the gate structure is self-aligned with the top source/drain region.

13. The method according to claim 12, wherein upper surfaces of the gate structure have an orientation and size that conform to an orientation and size of the top oxide spacer layer formed on bottom sides of the top source/drain region.

14. A method for manufacturing a vertical field-effect transistor, comprising:

forming a first semiconductor layer on a semiconductor substrate;

forming a second semiconductor layer comprising a first concentration of germanium on the first semiconductor layer;

forming a third semiconductor layer on the second semiconductor layer, wherein the first and third semiconductor layers each comprise a concentration of germanium which is greater than the first concentration of germanium;

patterning the first, second and third semiconductor layers into at least one fin;

covering the second semiconductor layer with a mask layer;

simultaneously growing a bottom source/drain region from the first semiconductor layer and a top source/drain region from the third semiconductor layer;

removing the mask layer from the second semiconductor layer;

simultaneously forming top and bottom spacer layers on the top and bottom source/drain regions; and forming a gate structure on and around the second semiconductor layer;

wherein simultaneously forming the top and bottom spacer layers comprises:

forming a germanium oxide layer on the top and bottom source/drain regions and on the second semiconductor layer; and performing an annealing process to convert the germanium oxide layer formed on the top and bottom source/drain regions into the top and bottom spacer layers.

* * * * *